United States Patent
Wu et al.

(10) Patent No.: US 9,589,924 B2
(45) Date of Patent: Mar. 7, 2017

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Jiun Yi Wu, Taoyuan County (TW); Yu-Min Liang, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 12 days.

(21) Appl. No.: 14/471,412

(22) Filed: Aug. 28, 2014

(65) Prior Publication Data

US 2016/0064315 A1    Mar. 3, 2016

(51) Int. Cl.
*H01L 23/498* (2006.01)
*H01L 23/00* (2006.01)

(52) U.S. Cl.
CPC ........ *H01L 24/81* (2013.01); *H01L 23/49838* (2013.01); *H01L 23/49816* (2013.01); *H01L 2224/16225* (2013.01); *H01L 2924/00011* (2013.01); *H01L 2924/01322* (2013.01); *H01L 2924/15311* (2013.01)

(58) Field of Classification Search
CPC .............. H01L 21/4853; H01L 23/822; H01L 23/49811
See application file for complete search history.

(56) References Cited

U.S. PATENT DOCUMENTS

| | | | | |
|---|---|---|---|---|
| 6,440,289 B1 * | 8/2002 | Woo | ............. | C25D 5/18 205/102 |
| 8,318,537 B2 * | 11/2012 | Pendse | ............. | H01L 21/563 257/778 |
| 2008/0222886 A1 * | 9/2008 | Hsu | ............. | H05K 1/116 29/850 |
| 2012/0126416 A1 * | 5/2012 | Lee | ............. | H01L 21/563 257/774 |

(Continued)

*Primary Examiner* — Ken Parker
*Assistant Examiner* — Warren H Kilpatrick
(74) *Attorney, Agent, or Firm* — WPAT, P.C., Intellectual Property Attorneys; Anthony King

(57) ABSTRACT

A semiconductor structure and a method for forming the same are provided. The semiconductor structure includes: a substrate comprising a recess portion filled with a conductive material; a conductive trace overlying and contacting the conductive material; a conductive pillar disposed on the conductive trace and over the recess portion of the substrate; and a semiconductor chip disposed on the conductive pillar, wherein the conductive trace comprises a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3.

20 Claims, 18 Drawing Sheets

(56) References Cited

U.S. PATENT DOCUMENTS

2013/0001769 A1\* 1/2013 Hou .................. H01L 23/49811
            257/737
2013/0134586 A1\* 5/2013 Jang ................... H01L 21/4846
            257/737

\* cited by examiner

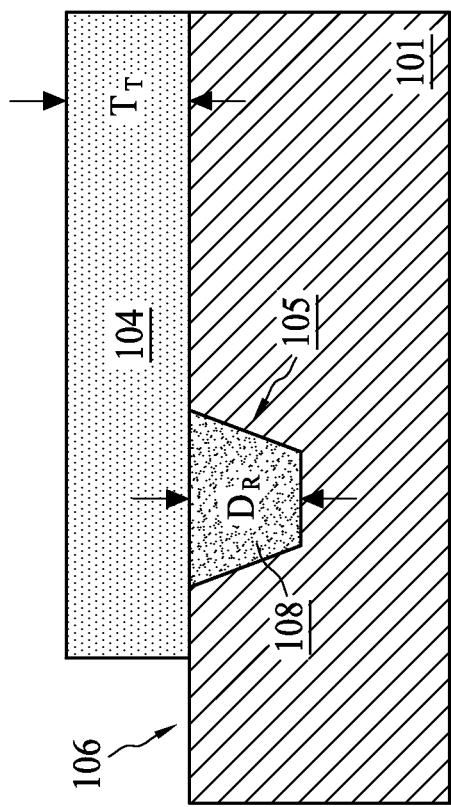
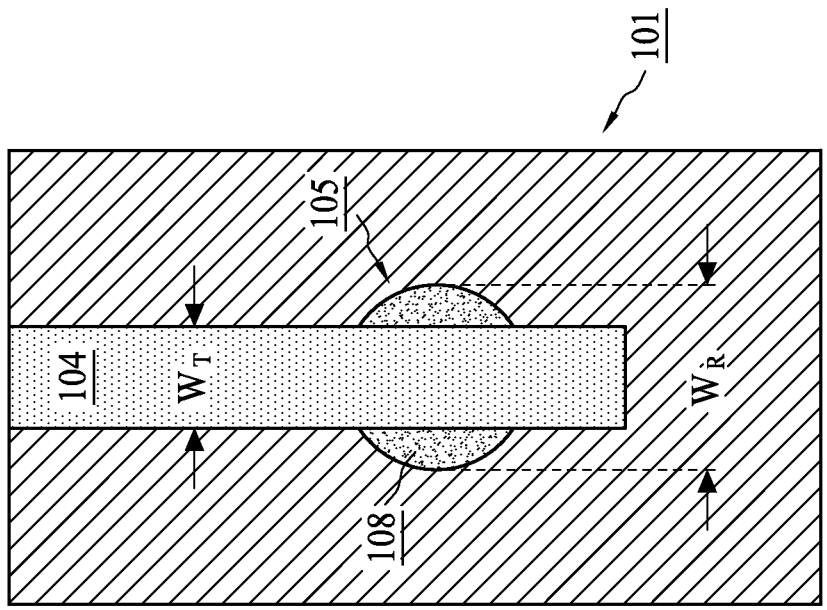
FIG. 3A
FIG. 3B

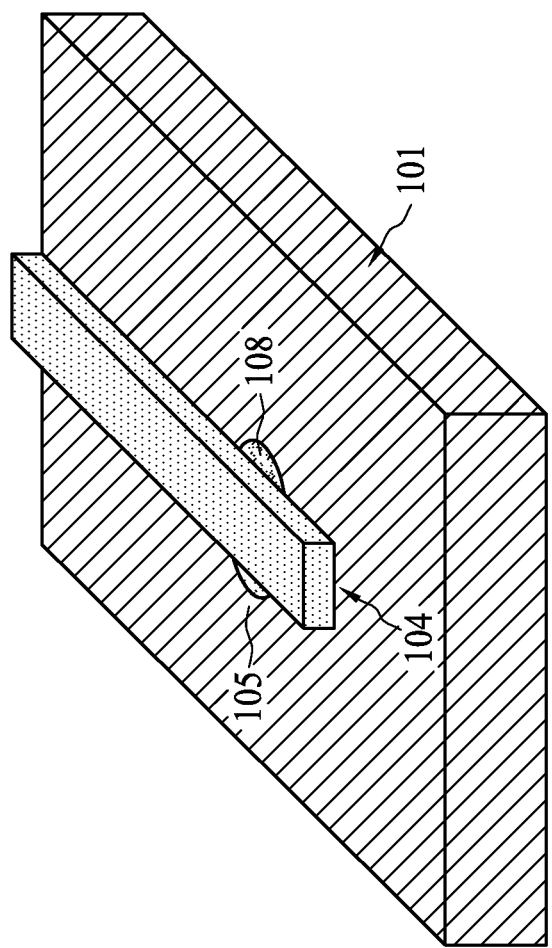
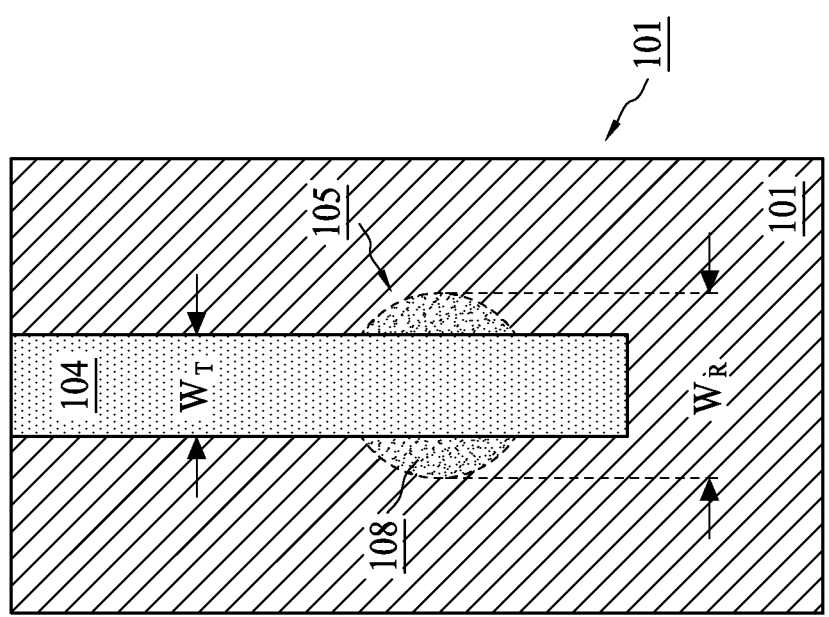
FIG. 4

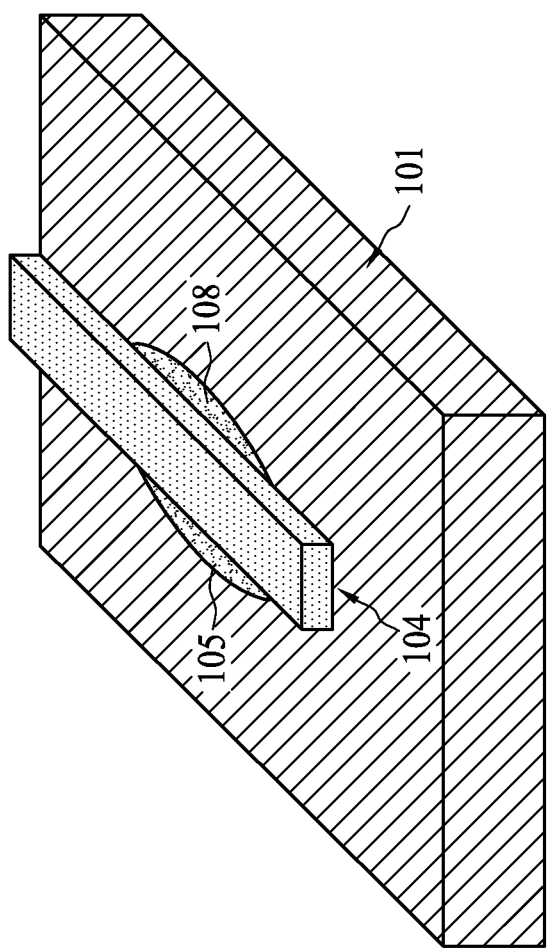
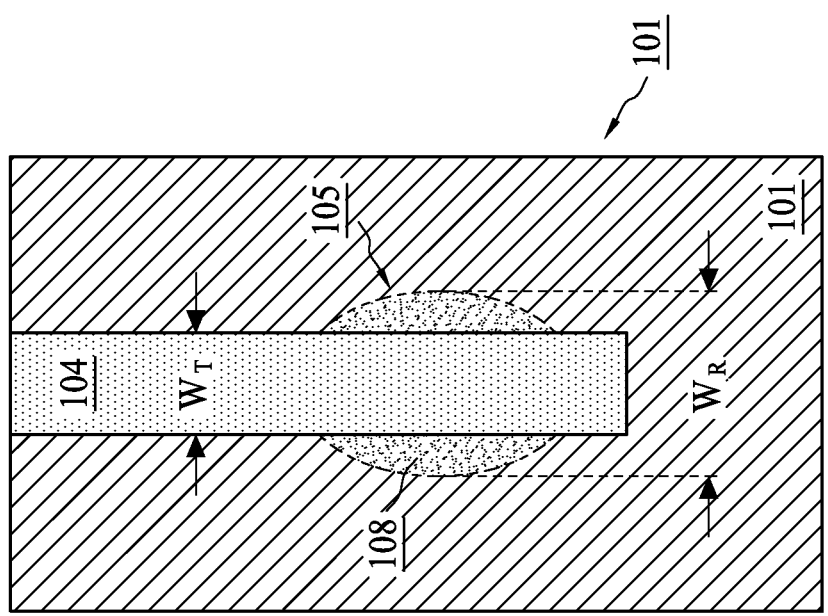
FIG. 5

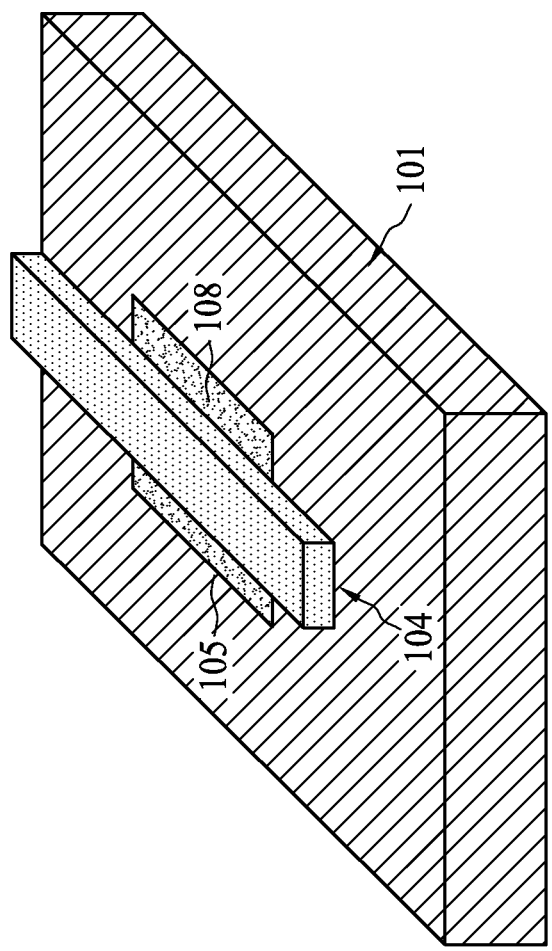
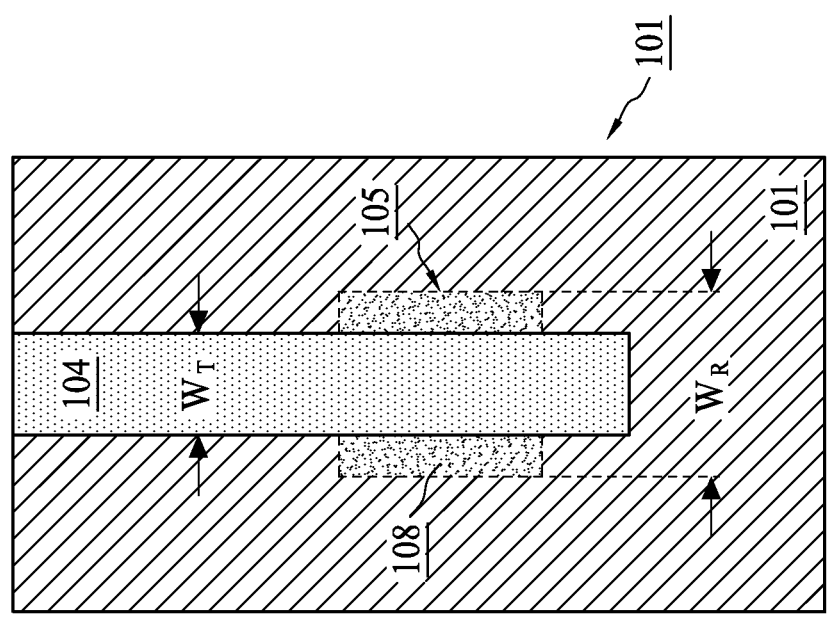
FIG. 6

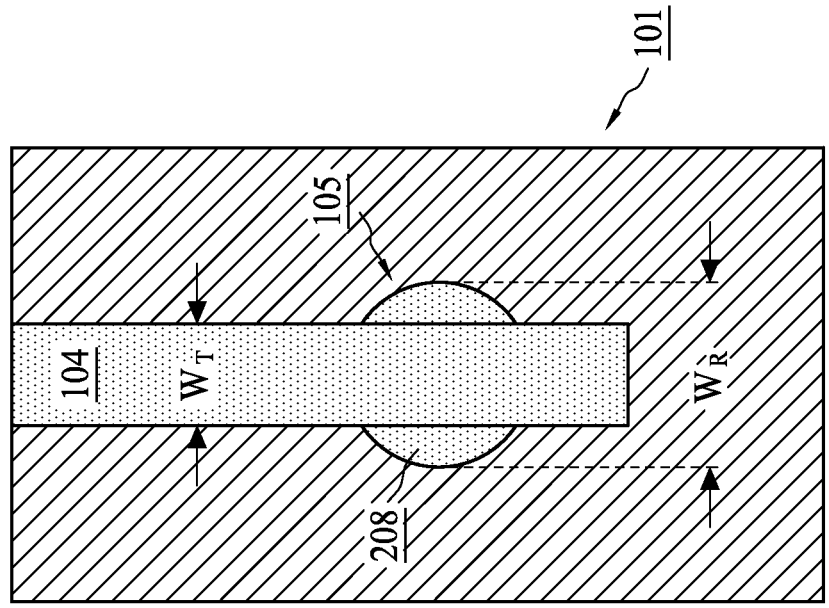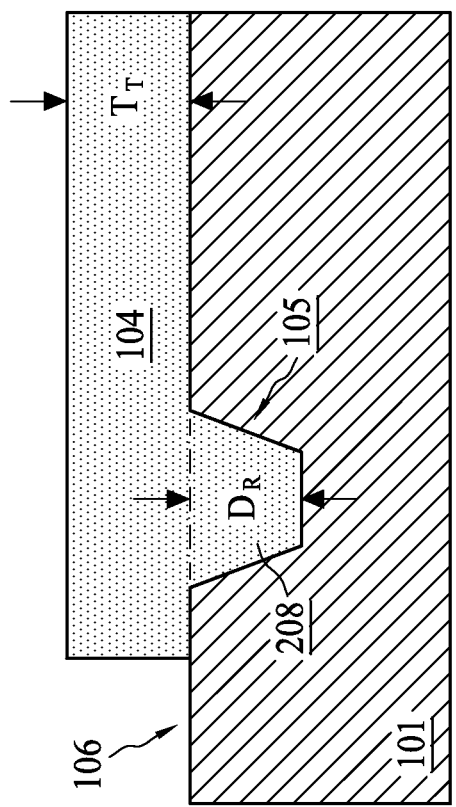
FIG. 8A
FIG. 8B

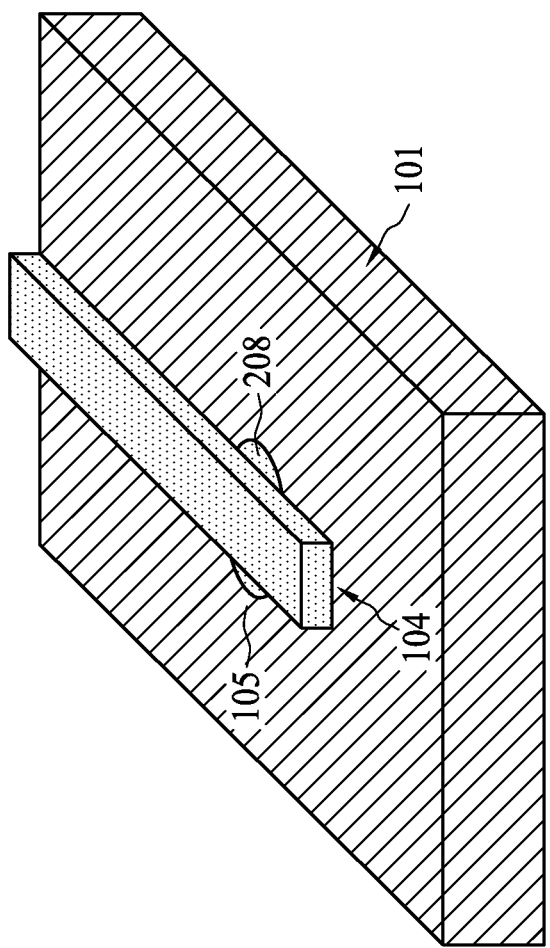
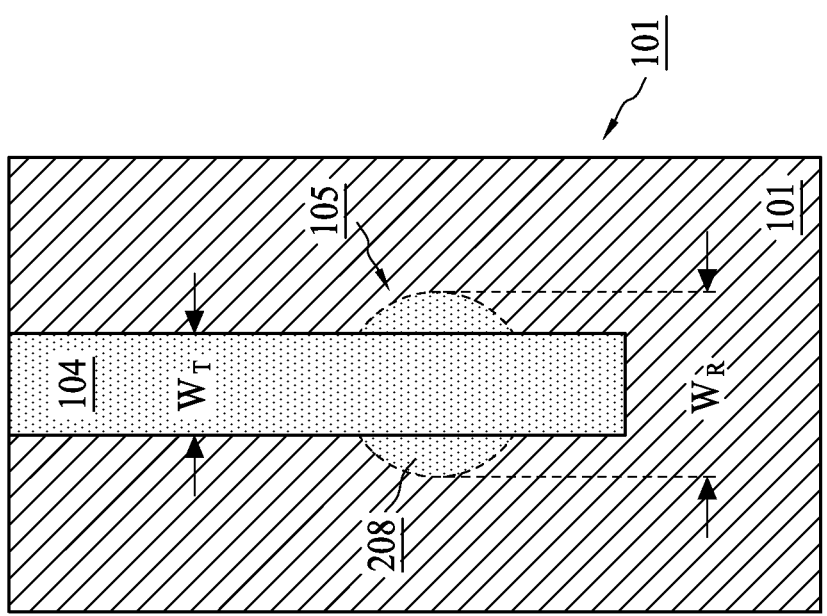
FIG. 9

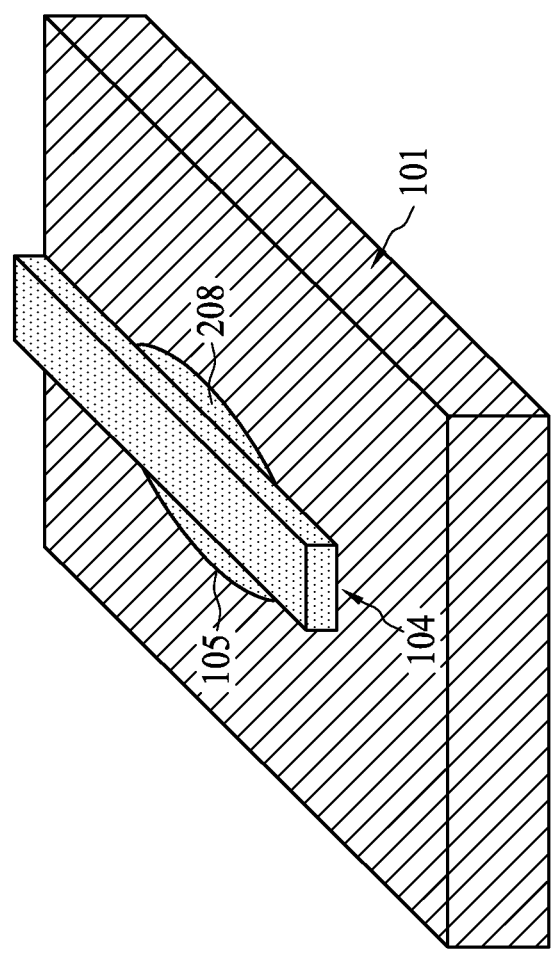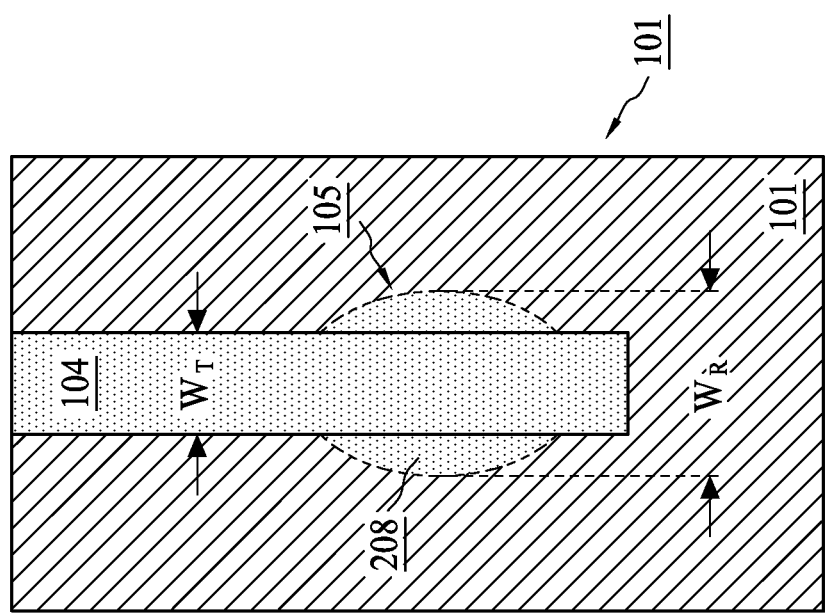
FIG. 10

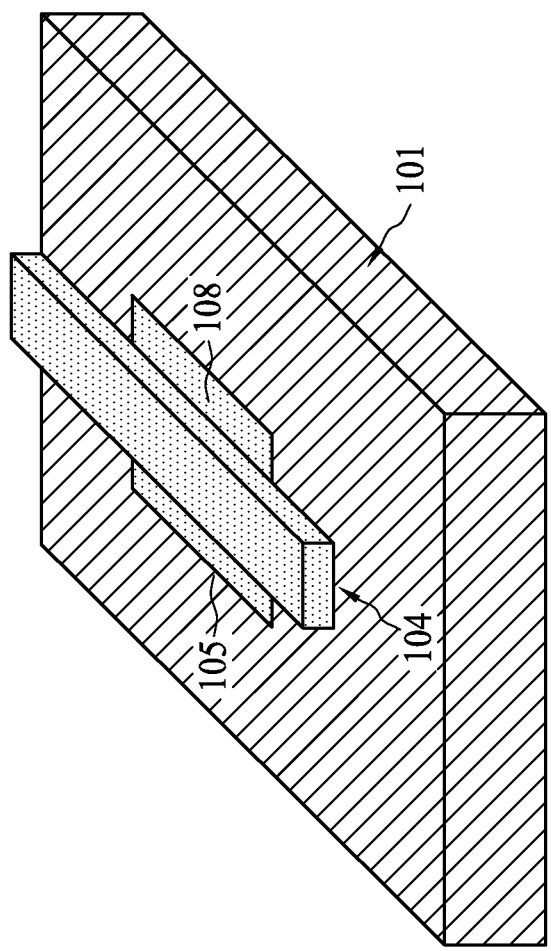
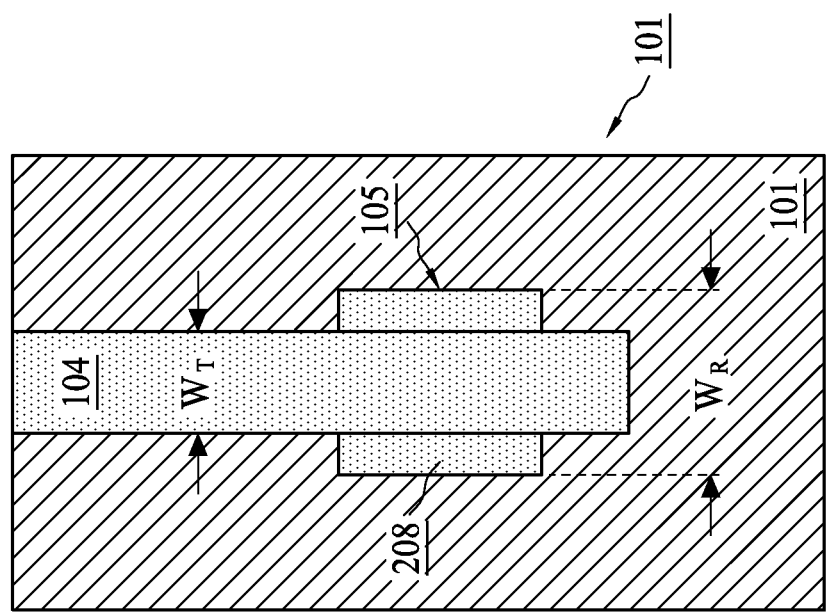
FIG. 11

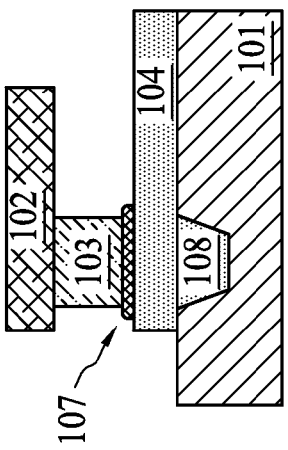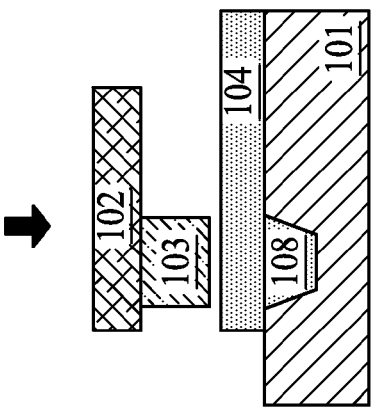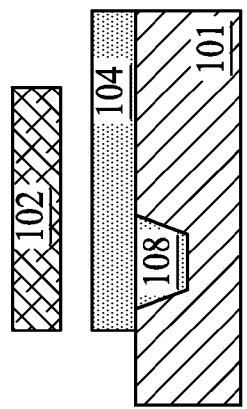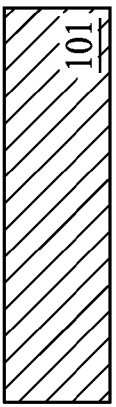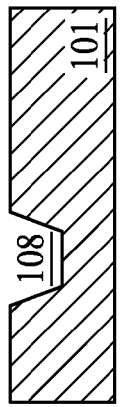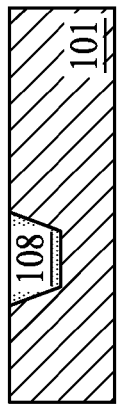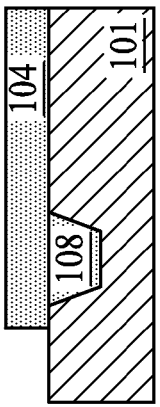

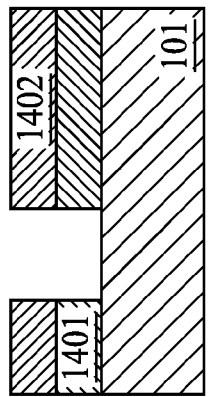  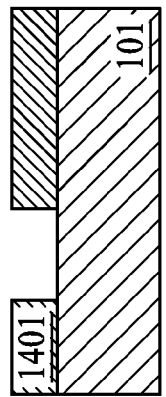  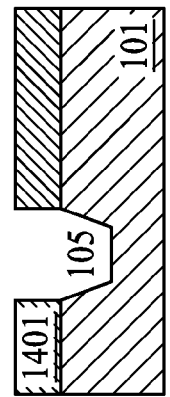  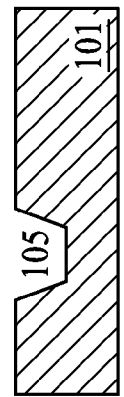
FIG. 14D     FIG. 14E     FIG. 14F     FIG. 14G
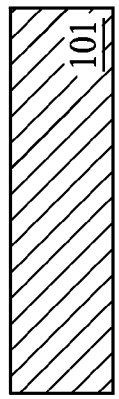  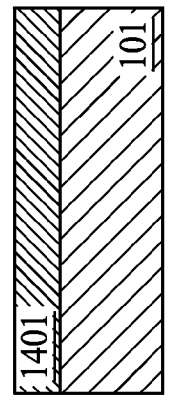  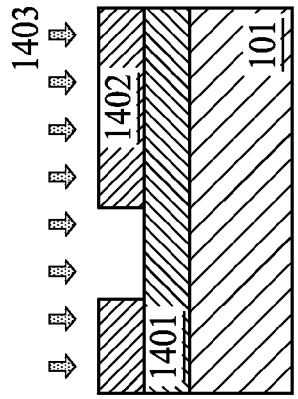 
FIG. 14A     FIG. 14B     FIG. 14C

SEMICONDUCTOR STRUCTURE AND METHOD OF MANUFACTURING THE SAME

FIELD

The present disclosure relates generally to a semiconductor structure and more particularly relates to a Bump-on-Trace (BOT) semiconductor structure.

BACKGROUND

Since the invention of integrated circuits, the semiconductor industry has experienced continuous rapid growth due to constant improvements in the integration density of various electronic components (i.e., transistors, diodes, resistors, capacitors, etc.) and semiconductor packages. For the most part, these improvements in integration density have come from repeated reductions in minimum feature size, allowing more components to be integrated into a semiconductor chip or package.

One approach for allowing more components to be integrated into a semiconductor package is the adoption of Bump-on-Trace (BOT) structures. BOT structures are used in flip chip packages, wherein metal bumps (for supporting device dies) directly land on metal traces of package substrates instead of being disposed on metal pads that have greater widths than the metal traces. The advantages of BOT structures include smaller chip area requirement and low manufacturing cost. In addition, BOT structures have the same reliability as conventional bond structures with metal pads.

For BOT structures the major bonding forces between metal traces and the package substrate include anchor forces due to dielectric roughness of the package substrate and some chemical bonding forces. However, the mismatch between the coefficient of thermal expansions of the semiconductor die and the package substrate may result in stress on the metal traces, causing the metal traces to peel off from the package substrate. In addition, for BOT structures with finer bump pitches (the distance between adjacent bonding bumps), since the width of the conductive traces decreases, the bonding force between conductive traces and the package substrate is smaller, which also causes the peeling off of the metal traces. In view of the above, there is a need to solve the aforementioned, as well as other, deficiencies in conventional BOT structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a cross-sectional view illustrating a substrate in accordance with FIG. 2 of the present disclosure.

FIG. 3B is a top view illustrating a substrate in accordance with FIG. 2 of the present disclosure.

FIG. 4 is a schematic diagram illustrating a substrate in accordance with some embodiments of the present disclosure.

FIG. 5 is a schematic diagram illustrating a substrate in accordance with some embodiments of the present disclosure.

FIG. 6 is a schematic diagram illustrating a substrate in accordance with some embodiments of the present disclosure.

FIG. 8A is a cross-sectional view illustrating a substrate in accordance with FIG. 7 of the present disclosure.

FIG. 8B is a top view illustrating a substrate in accordance with FIG. 7 of the present disclosure.

FIG. 9 is a schematic diagram illustrating a substrate in accordance with some embodiments of the present disclosure.

FIG. 10 is a schematic diagram illustrating a substrate in accordance with some embodiments of the present disclosure.

FIG. 11 is a schematic diagram illustrating a substrate in accordance with some embodiments of the present disclosure.

FIGS. 13A-13G schematically illustrates a method of manufacturing a semiconductor structure in accordance with some embodiments of the present disclosure.

FIGS. 14A-14G schematically illustrate a method for forming a recess portion on a surface of a substrate in accordance with some embodiments of the present disclosure.

DETAILED DESCRIPTION

Figure 1:
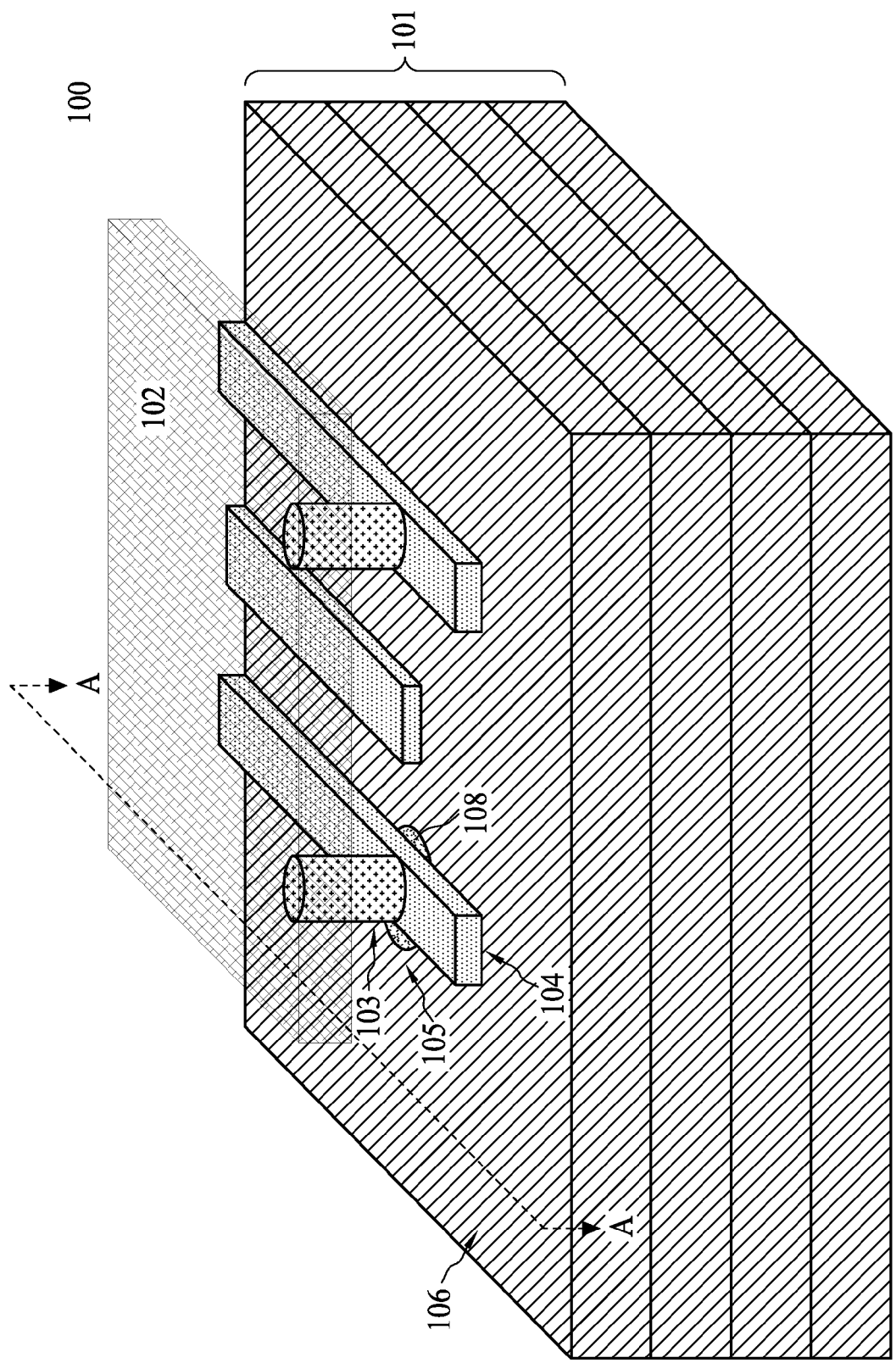
FIG. 1 is a schematic diagram illustrating a semiconductor structure in accordance with some embodiments of the present disclosure.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps (operations) and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the growing demand for finer pitches in advanced device packaging, Bump-on-Trace (BOT) semiconductor structures are more and more popular. However, as bump pitches get smaller, the risk of the peeling off of the traces gets higher. In order to address the aforementioned problem, present disclosure provides a semiconductor structure, wherein a substrate thereof comprises a recess portion (filled with a conductive material) underlying a conductive trace of the BOT structure, and wherein the recess portion significantly increases the bonding force between the conductive trace and the substrate.

In reference to the drawings, FIG. 1 is a schematic diagram illustrating a semiconductor structure 100 in accordance with some embodiments of the present disclosure. The semiconductor structure 100 includes a substrate 101, a semiconductor chip 102, conductive pillars 103, conductive traces 104 provided on a surface 106 of the substrate 101 and recess portions 105 filled with a conductive material 108.

Figure 2:
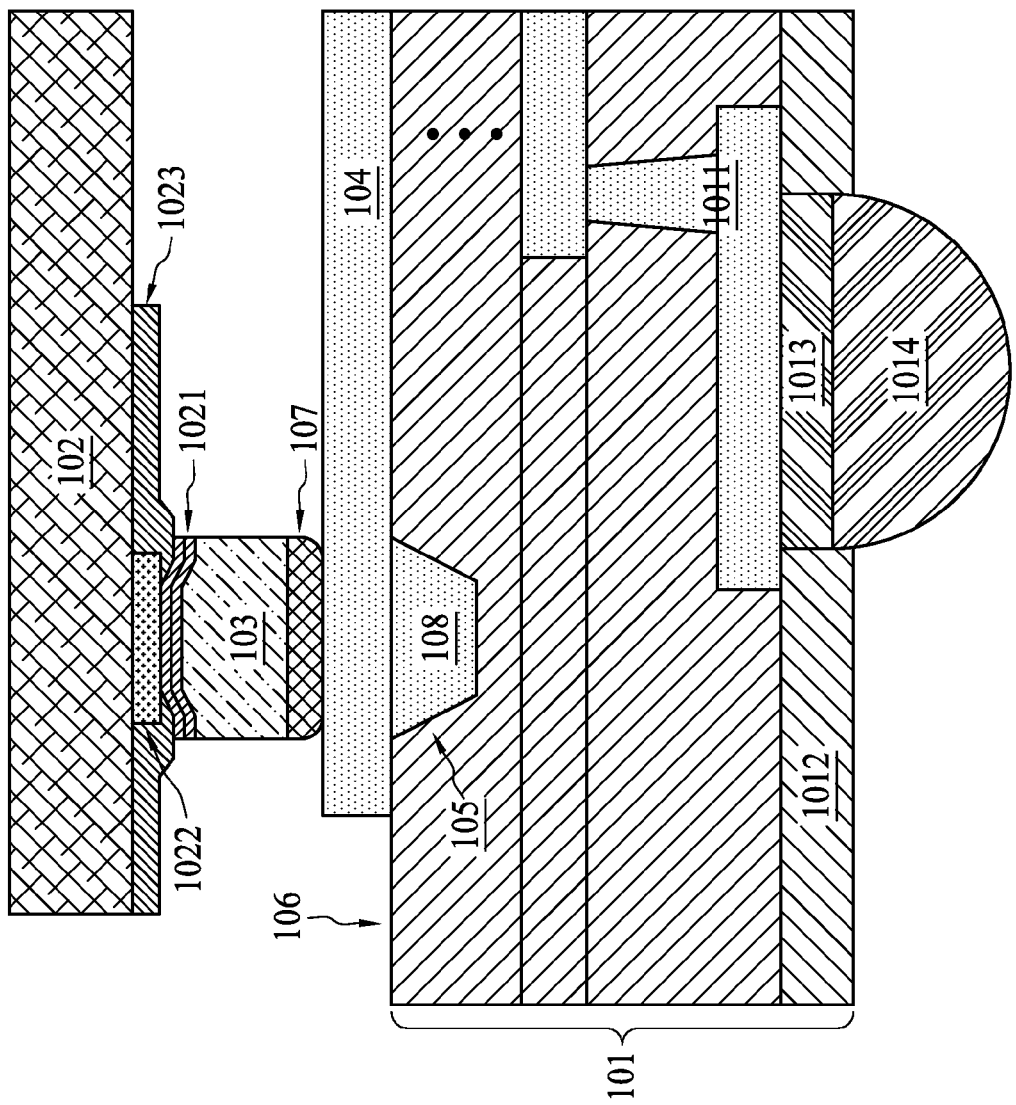
FIG. 2 is a cross-sectional view illustrating a semiconductor structure in accordance with FIG. 1 of the present disclosure.

FIG. 2 is a cross-sectional view illustrating in detail the semiconductor structure 100 of FIG. 1 of the present disclosure, wherein the exemplary cross-sectional view is obtained from the plane crossing line A-A in FIG. 1. The semiconductor structure 100 includes a substrate 101. The substrate 101 has a recess portion 105, which is recessed from a surface 106 of the substrate 101 and filled with a conductive material 108. The conductive material 108 may be formed of the same material as the conductive trace 104. A conductive trace 104 is provided on the surface 106 of the substrate 101 and is such arranged that it overlies and directly contacts the conductive material 108 (within the recess portion 105). The conductive pillar 103 that provides an electrical path and a mechanical connection within the semiconductor structure 100. The conductive pillar 103 is coupled to the conductive trace 104 and is disposed proximal to and over the recess portion 105 of the substrate 101. The conductive pillar 103 may be coupled to the conductive trace 104 with a conductor 107. In some embodiments, the conductor 107 may be made of a lead-free solder, a eutectic solder, or the like. The semiconductor chip 102 that is coupled to the conductive pillar 103, namely the semiconductor chip 102 and the conductive trace 104 are electrically connected and coupled together by the conductive pillar 103. The conductive material 108 within the recess portion 105 greatly enhances the bonding force between the conductive trace 104 and the substrate 101.

In some embodiments, the semiconductor chip 102 is coupled to the substrate 101 through conductive pillars 103 in flip-chip configuration (as known as controlled collapse chip connection or C4). Compared with conventional packaging techniques such as wire bonding and tape automatic bonding (TAB), a flip-chip package has shorter signal transmission path between the semiconductor chip and the substrate and thus it has better electrical properties. In addition, a flip-chip package may be designed to expose the back surface of the semiconductor chip (one of the mains surface not facing the substrate) so as to increase heat dissipation rate. In some embodiments the semiconductor structure 100 may be a semiconductor package which provides protection against impact and corrosion and dissipates heat produced in the semiconductor chip.

The semiconductor chip 102 may comprise logic devices, eFlash device, memory device, microelectromechanical (MEMS) devices, analog devices, CMOS devises, combinations of these, or the like. In some embodiments, the semiconductor chip 102 is coupled to the conductive pillar 103 in the following manners. First, a bond pad 1022 and a passivation layer 1023 (which is generally made of a polyimide material) are formed sequentially on the semiconductor chip 102. The passivation layer 1023 exposing a portion of the bond pad 1022. An under bump metallurgy (UBM) structure 1021 is then formed over the exposed portion of the bond pad 1022 and the passivation layer 1023. At the final operation the conductive pillar 103 is coupled to the UBM structure 1021, thereby electrically connecting the semiconductor chip 102 and conductive pillar 103.

In some embodiments, the UBM structure 1021 comprises a metallic adhesive layer forming on the bond pad 1022, a barrier layer for preventing diffusion, and a solder wettable layer for connecting the conductive pillar 103. The UBM structure 1021 provides functions such as bump connection, diffusion barrier, proper adhesion and so on between the conductive pillar 103 and the bond pad 1022 of the semiconductor chip 102, such that a solder material can be applied to the UBM structure 1021 and is then subjected to a reflow process to form the required conductive pillar 103. The UBM structure usually comprises titanium-copper-nickel (Ti—Cu—Ni) metallic layers, and can be fabricated by for example sputtering, evaporation, plating and so on.

The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. In some embodiments, the substrate 101 includes multi-layered substrates, gradient substrates, hybrid orientation substrates, any combinations thereof and/or the like, such that the semiconductor package can accommodate more active and passive components and circuits. In some embodiments, the substrate 101 may be formed using multiple epoxy-containing insulative layers with through-holes that are filled with conductive plugs or filler material. Multiple level metallization structures 1011 (e.g., conductive plugs, filler materials or conductive traces formed within the multiple epoxy-containing insulative layers) are provided to form conductive path in the vertical directions. In some embodiments, solder mask 1012 is positioned on the bottom surface of the substrate 101, surrounding a ball land 1013, which are configured to receive an external terminal, such as a solder ball 1014, for making the external connectors of the semiconductor structure. In some embodiments, the substrate 101 comprises a second conductive trace in a layer different from the conductive trace, and an epoxy-containing insulative material separating the conductive trace and the second conductive trace.

In some embodiments, the substrate 101 comprises a PCB (Printed Circuit Board). In some embodiments, the substrate 101 may be a package substrate that includes epoxy-containing materials, such as prepreg (PPG), rubber coated copper (RCC), or Ajinomoto build-up film (ABF). A prepreg (PPG, "pre-impregnated") is a fiber reinforced polymer reinforcement that is pre-impregnated with an epoxy resin. Advantages of prepregs include ease of use, consistent properties, and high quality surface finish. Ajinomoto build-up films (ABF) are used as package substrates due to their features of good reliability, excellent processability and well-balanced properties. ABF shows good insulation reliability, and specifically they are designed to be etched to form micro holes/trenches on the resin surface.

The conductive traces 104 are provided on the surface 106 of the substrate 101 to form a pattern of electronic connections. The conductive traces 104 may be formed of substantially pure copper, aluminum copper, or other metallic materials such as tungsten, nickel, palladium, gold, and/or alloys thereof. Compared with conventional bonding techniques, the present disclosure adopts the Bump-on-Trace (BOT) structure, in which the conductive pillars 103 are directly disposed on the conductive traces 104 instead of being disposed on bonding pads (conventional approach) that have greater widths than the those of the conductive traces 104, thereby reducing the required chip area and bump pitch. The BOT structures also have the same reliability as conventional bond structures with bonding pads.

In some embodiments, conductive pillars 103 are provided, in place of conventional solder bumps, as the bonding elements, such that these conductive pillars 103 are disposed on the conductive traces 104, namely the semiconductor chip 102 is coupled to conductive traces 104 by these conductive pillars 103. The conductive pillars 103 provide both an electrical conduction path and a thermal conduction path between the semiconductor chip 102 and the substrate 101. The conductive pillars 103 of the present disclosure can be a prism or a cylinder. It should be noted that the melting point of the conductive pillar 103 is higher than the fusion temperature of the conductor 107.

In some embodiments, conductive pillars 103 are made of metal. In some embodiments, the material of the conductive pillar 103 is selected from tin, lead, copper, gold, silver, zinc, bismuth, magnesium, antimony, indium and an alloy thereof. Using copper as the material for the conductive pillar 103 has the following advantages: compared with conventional solder bump techniques, using copper pillars as the bonding elements not only helps achieve finer pitch with minimum probability of bump bridging but also reduces the capacitance load for the circuits (electronic interconnections). Copper pillars offer higher reliability, improved electrical and thermal performance. While conventional solder bumps collapse during solder reflow, copper pillars retain their shape. However, as the pitch between adjacent conductive traces 104 (as well as the width of the conductive traces 104) gets narrower, these conductive traces 104 tend to peel off from the substrate 101.

FIGS. 3A and 3B are a cross-sectional view and a top view illustrating the substrate 101 of FIG. 2 of the present disclosure. The conductive trace 104 formed on the surface 106 of the substrate 101 is a line trace that has a longitudinal direction (that is parallel to the direction in which the conductive trace 104 extends) and a width/lateral direction (which is perpendicular to the longitudinal direction). The conductive trace 104 has a thickness $T_T$ (namely the height of the conductive trace 104 starting from the surface 106 of the substrate 101) and a width $W_T$ in its width/lateral direction. In some embodiments, $W_T$ is smaller than 20 microns. In addition, the recess portion 105 has a depth $D_R$ which is defined as the distance from the bottom of the recess portion 105 to the bottom surface of the conductive trace 104 (or to the surface 106 of the substrate 101). The recess portion 105 also has a width $W_R$ in the width/lateral direction of the conductive trace 104.

In some embodiments, the ratio of $W_R$ to $W_T$ is set to a value ranging from about 0.25 to about 1.8 so as to provide a greater bonding force between the conductive trace 104 and the substrate 101. In some embodiments, the ratio of $W_R$ to $W_T$ is set to a value ranging from about 0.25 to about 0.8 such that the recess portion 105 is narrower than the conductive trace 104. In some embodiments, the ratio of $W_R$ to $W_T$ is set to a value ranging from about 0.8 to about 1.2 such that the recess portion 105 and the conductive trace 104 have roughly the same width. In some embodiments, the ratio of $W_R$ to $W_T$ is set to a value ranging from about 1.2 to about 1.8 such that the recess portion 105 is wider than the conductive trace 104, as is the case shown in FIG. 3B. It should be noted that the conductive trace 104 adheres to the substrate 101 more as the recess portion 105 gets wider.

In some embodiments, the ratio of $D_R$ to $T_T$ is set to a value ranging from about 0.1 to about 3 so as to provide a greater bonding force between the conductive trace 104 and the substrate 101. In some embodiments, the ratio of $D_R$ to $T_T$ is set to a value ranging from about 0.3 to about 0.8 such that the recess portion 105 is shallower than the conductive trace 104. In some embodiments, the ratio of $D_R$ to $T_T$ is set to a value ranging from about 0.8 to about 1.2 such that the recess portion 105 and the conductive trace 104 have roughly the same thickness (depth). In some embodiments, the ratio of $D_R$ to $T_T$ is set to a value ranging from about 1.2 to about 3 such that the recess portion 105 is thicker (deeper) than the conductive trace 104.

The recess portion 105 may have different geometric dimensions. The recess portion 105 may be of the shape of a taper, prism or a cylinder. In addition, as shown in FIGS. 4-6, the recess portion 105 may be such configured that its projection on the surface 106 of the substrate 101 has different shapes. As shown in FIG. 4, the projection of the recess portion 105 on the surface 106 is circular. As shown in FIG. 5, the projection of the recess portion 105 on the surface 106 is elliptical (oval). As shown in FIG. 6, the projection of the recess portion 105 on the surface 106 is rectangle. In some embodiments, the projection of the recess portion 105 on the surface 106 includes polygon or other geometric shapes.

Figure 7:
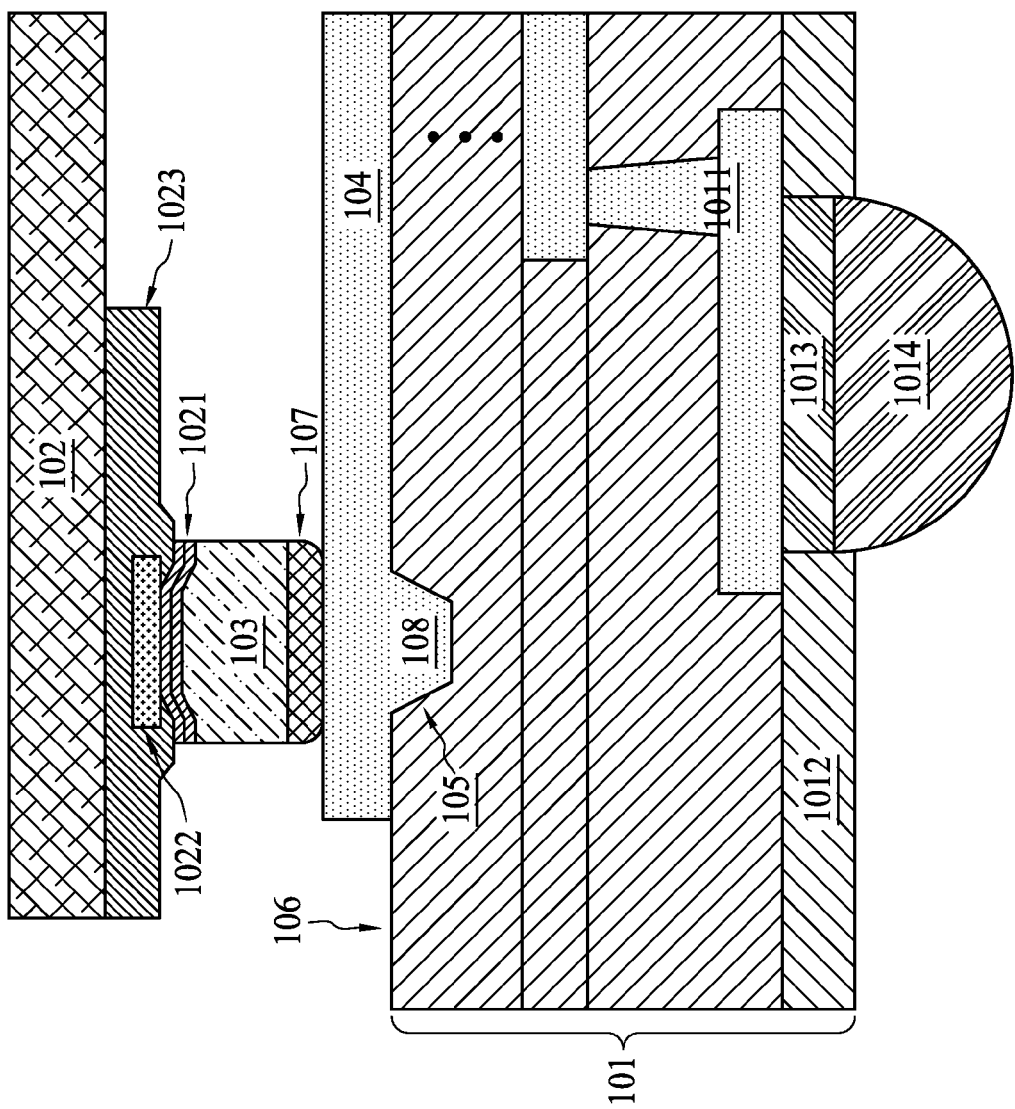
FIG. 7 is a cross-sectional view illustrating a semiconductor structure in accordance with some embodiments of the present disclosure.

FIG. 7 is a cross-sectional view illustrating a semiconductor structure 200 in accordance with some embodiments of the present disclosure. The semiconductor structure 100 includes a substrate 101. The substrate 101 has multiple level metallization structures 1011 to form conductive path in the vertical directions. A solder mask 1012 is positioned on the bottom surface of the substrate 101, surrounding a ball land 1013, which are configured to receive an external terminal, such as a solder ball 1014, for making the external connectors of the semiconductor structure. The substrate 101 further comprises a recess portion 105, which is recessed from a surface 106 of the substrate 101. A conductive trace 104 is provided on the surface 106 of the substrate 101 and is such arranged that it overlies the recess portion 105. The conductive trace 104 has a protruding portion 208 embedded in and filling the recess portion 105. The engagement of the protruding portion 208 of the conductive trace 104 and the recess portion 105 of the substrate 101 greatly increases the bonding force between the conductive trace 104 and the substrate 101.

The semiconductor structure 100 also includes a conductive pillar 103 that provides an electrical path and a mechanical connection within the semiconductor structure 100. The conductive pillar 103 is coupled to the conductive trace 104 and is disposed proximal to and over the recess portion 105 of the substrate 101. The conductive pillar 103 may be coupled to the conductive trace 104 with a conductor 107. In some embodiments, the conductor 107 may be made of a lead-free solder, a eutectic solder, or the like. The semiconductor structure 100 further includes a semiconductor chip 102 that is coupled to the conductive pillar 103 in the following manner. First, a bond pad 1022 and a passivation layer 1023 are formed sequentially on the semiconductor chip 102. The passivation layer 1023 exposing a portion of the bond pad 1022. An UBM structure 1021 is then formed over the exposed portion of the bond pad 1022 and the passivation layer 1023. At the final operation the conductive pillar 103 is coupled to the UBM structure 1021, thereby electrically connecting the semiconductor chip 102 and the conductive pillar 103.

FIGS. 8A and 8B are a cross-sectional view and a top view illustrating the substrate 101 of FIG. 7 of the present disclosure. The conductive trace 104 formed on the surface 106 of the substrate 101 is a line trace that has a longitudinal direction and a width/lateral direction. The conductive trace 104 has a thickness $T_T$ and a width $W_T$ in its width/lateral direction. In some embodiments, $W_T$ is smaller than 20 microns. In addition, the recess portion 105 (or the protruding portion 208) has a depth $D_R$. The recess portion 105 (or the protruding portion 208) also has a width $W_R$ in the width/lateral direction of the conductive trace 104.

In some embodiments, the ratio of $W_R$ to $W_T$ is set to a value ranging from about 0.25 to about 1.8 so as to provide a greater bonding force between the conductive trace 104 and the substrate 101. In some embodiments, the ratio of $W_R$ to $W_T$ is set to a value ranging from about 0.25 to about 0.8 such that the recess portion 105 is narrower than the conductive trace 104. In some embodiments, the ratio of $W_R$ to $W_T$ is set to a value ranging from about 0.8 to about 1.2 such that the recess portion 105 and the conductive trace 104 have roughly the same width. In some embodiments, the ratio of $W_R$ to $W_T$ is set to a value ranging from about 1.2 to about 1.8 such that the recess portion 105 is wider than the conductive trace 104, as is the case shown in FIG. 8B. It should be noted that the conductive trace 104 adheres to the substrate 101 more as the recess portion 105 gets wider.

In some embodiments, the ratio of $D_R$ to $T_T$ is set to a value ranging from about 0.1 to about 3 so as to provide a greater bonding force between the conductive trace 104 and the substrate 101. In some embodiments, the ratio of $D_R$ to $T_T$ is set to a value ranging from about 0.3 to about 0.8 such that the recess portion 105 is shallower than the conductive trace 104. In some embodiments, the ratio of $D_R$ to $T_T$ is set to a value ranging from about 0.8 to about 1.2 such that the recess portion 105 and the conductive trace 104 have roughly the same thickness (depth). In some embodiments, the ratio of $D_R$ to $T_T$ is set to a value ranging from about 1.2 to about 3 such that the recess portion 105 is thicker (deeper) than the conductive trace 104.

The recess portion 105 may have different geometric dimensions. The recess portion 105 may be of the shape of a taper, prism or a cylinder. In addition, as shown in FIGS. 9-11, the recess portion 105 may be such configured that its projection on the surface 106 of the substrate 101 has different shapes. As shown in FIG. 9, the projection of the recess portion 105 on the surface 106 is circular. As shown in FIG. 10, the projection of the recess portion 105 on the surface 106 is elliptical (oval). As shown in FIG. 11, the projection of the recess portion 105 on the surface 106 is rectangle. In some embodiments, the projection of the recess portion 105 on the surface 106 includes polygon or other geometric shapes.

Figure 12:
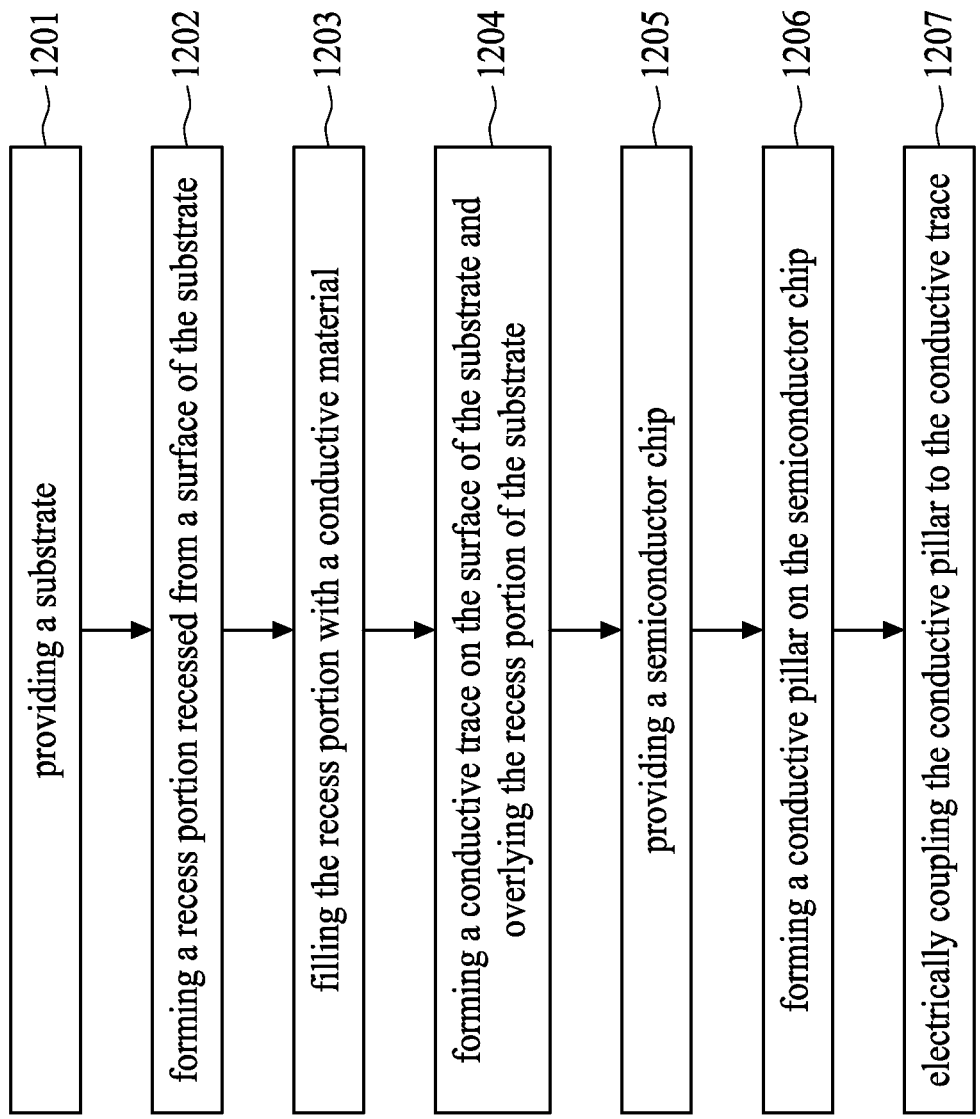
FIG. 12 represents a flow chart of manufacturing a semiconductor structure in accordance with some embodiments of the present disclosure.

FIG. 12 is a flowchart of a method of manufacturing a semiconductor structure as shown in FIG. 2. In operation 1201, a substrate is provided. In operation 1202, a recess portion is formed, wherein the recess portion is recessed from a surface of the substrate and may be configured to have different geometrical dimensions. In operation 1203, the recess portion is filled with a conductive material. In operation 1204, a conductive trace is formed on the surface of the substrate, wherein the conductive trace overlies and directly contacts the recess portion. In operation 1205, a semiconductor chip is provided. In operation 1206, a conductive pillar is formed on the semiconductor chip. In operation 1207, the conductive pillar is electrically coupled to the conductive trace. The conductive trace comprises (in a configuration same as those shown FIGS. 3A and 3B) a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3.

FIGS. 13A-13G schematically illustrates operations of the method of FIG. 12. In FIG. 13A, a substrate 101 is provided. In FIG. 13B, a recess portion 105 is recessed from a surface of the substrate 101. In FIG. 13C, the recess portion 105 is filled with a conductive material 108. In FIG. 13D, a conductive trace 104 is formed on the surface of the substrate 101, wherein the conductive trace 104 overlies and directly contacts the recess portion 105 (or the conductive material 108). In FIG. 13E, a semiconductor chip 102 is provided. In FIG. 13F, a conductive pillar 103 is formed on the semiconductor chip 102. In FIG. 13G, the conductive pillar 103 is electrically coupled to the conductive trace 104 (with a conductor 107) in a BOT configuration.

In some embodiments, the operation 1202 ("forming a recess portion on a surface of the substrate," namely the operation shown in FIG. 13B) comprises etching the surface of the substrate to form the recess portion, in which the surface of the substrate, except the portion of the surface where the recess portion is indented to be located, is protected from the etchant by a masking material (etching mask) which resists etching. The etching process may comprise wet etching and dry etching. For the wet etching process, the exposed surface of a substrate is dissolved when immersed in a bath of liquid-phase ("wet") etchants, which must be agitated to achieve good process control, wherein wet etchants are usually isotropic. For the dry etching process, the exposed surface of a substrate is bombarded by ions (usually a plasma of reactive gases such as fluorocarbons, oxygen, chlorine, boron trichloride; sometimes with addition of nitrogen, argon, helium and other gases). Unlike with many of the wet chemical etchants used in wet etching, the dry etching process typically etches directionally or anisotropically. The dry etching process comprises ion milling (sputter etching), reactive-ion etching (RIE), deep reactive-ion etching (DRIE) and so on.

FIGS. 14A-14G illustrates a method for etching the surface of the substrate to form the recess portion. In FIG. 14A, substrate 101 is provided. In FIG. 14B, a photoresist layer 1401 is formed on a surface of the substrate 101 (i.e., the photoresist layer 1401 is coated on the substrate 101). In FIG. 14C, a photomask 1402 having a predefined pattern (or an opening) is provided on the photoresist layer 1401 and a UV light 1403 is illuminated on the photomask 1402. As shown in FIG. 14D, after illumination, the photoresist layer 1401 is patterned to form an opening where a portion of a surface of the substrate 101 is exposed and then the patterned photoresist layer 1401 is cured. In FIG. 14E, the photomask 1402 is removed. In FIG. 14F, an etching process is applied, wherein the etching process may be a wet etching process using wet chemical etchants or a dry etching process using a plasma of reactive gases, and wherein the patterned photoresist layer 1401 acts as an etching mask and a recess portion 105 is etched and formed on the surface of the substrate 101. In FIG. 14G, the patterned photoresist layer 1401 is stripped off, thereby creating a substrate with a recess portion.

In some embodiments, the operation 1202 ("forming a recess portion on a surface of the substrate," namely the operation shown in FIG. 13B) comprises laser drilling the surface of the substrate to form the recess portion, wherein drilling of the recess portion occurs through melting (or vaporization) of the substrate material through absorption of energy from a focused laser beam. Advantages of laser drilling include non-contact processing, low heat input into the substrate material and flexibility to drill different substrate materials. Other benefits include drilling sub-micron holes and drilling at angles.

In some embodiments, the operation 1204 ("forming a conductive trace on the surface of the substrate," namely the operation shown in FIG. 13D) comprises the following sub-operations: forming a seed layer on the surface of the substrate; patterning the seed layer; and forming the conductive trace on the patterned seed layer. In some embodiments, forming a seed layer on the surface of the substrate comprises sputtering a layer of titanium, tantalum or alloy thereof on the surface of the substrate as the seed layer. The seed layer of titanium, tantalum or alloy thereof is a suitable for electroplating the conductive trace on the surface of the substrate. In some embodiments, patterning the seed layer comprising removing a portion of the seed layer to expose a portion of the surface of the substrate. The exposed portion of the surface of the substrate would not be electroplated due to the lack of the seed layer material, thus the conductive trace would only be formed on the patterned seed layer.

Figure 15A:
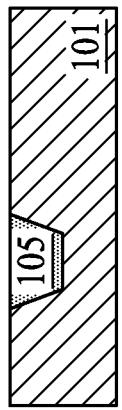
FIGS. 15A-15D schematically illustrate a method of forming a conductive trance on a surface of a substrate in accordance with some embodiments of the present disclosure.
Figure 15B:
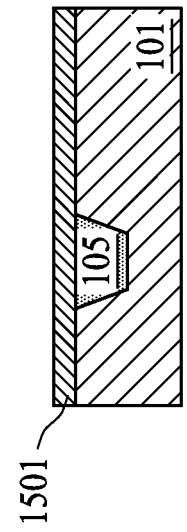
Figure 15C:
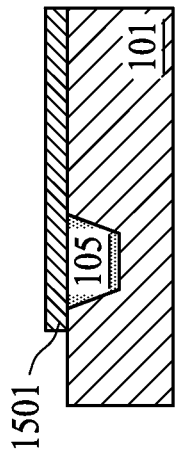
Figure 15D:
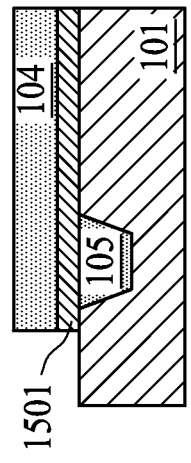

FIGS. 15A-15D illustrate a method for performing the operation 1204 ("forming a conductive trace on the surface of the substrate," namely the operation shown in FIG. 13D). In FIG. 15A, a substrate 101 with a recess portion 105 is provided. In FIG. 15B, a seed layer 1501 is formed on a surface of the substrate 101. In FIG. 15C, the seed layer 1501 is being patterned. In FIG. 15D, a conductor trace 104 is formed on the patterned seed layer 1501 by an electrochemical deposition process such as electrolytic or electroless plating. For the operation shown in FIG. 15C, the patterning of the seed layer 1501 may use the same method as that depicted in FIGS. 14A-14G. For instance, a patented photoresist layer may be first formed on the seed layer 1501, the patterned photoresist layer acts as an etching mask and after an etching process is applied the exposed portion of the seed layer 1501 is etched away from the substrate 101.

In some embodiments, the operation 1206 ("coupling the conductive pillar to the conductive trace," namely the operation shown in FIG. 13F) further comprises coupling the conductive pillar to the conductive trace through a conductor, which may be made of a lead-free solder, a eutectic solder, or the like. In some embodiments, the semiconductor chip is coupled to the conductive pillar in the following manners: first, a bond pad and a passivation layer are formed sequentially on the semiconductor chip, wherein the passivation layer exposing a portion of the bond pad; an UBM structure is then formed over the exposed portion of the bond pad and the passivation layer; and the conductive pillar is coupled to the UBM structure, thereby electrically connecting the semiconductor chip and conductive pillar (please refer to the structure shown in FIG. 2).

Figure 16:
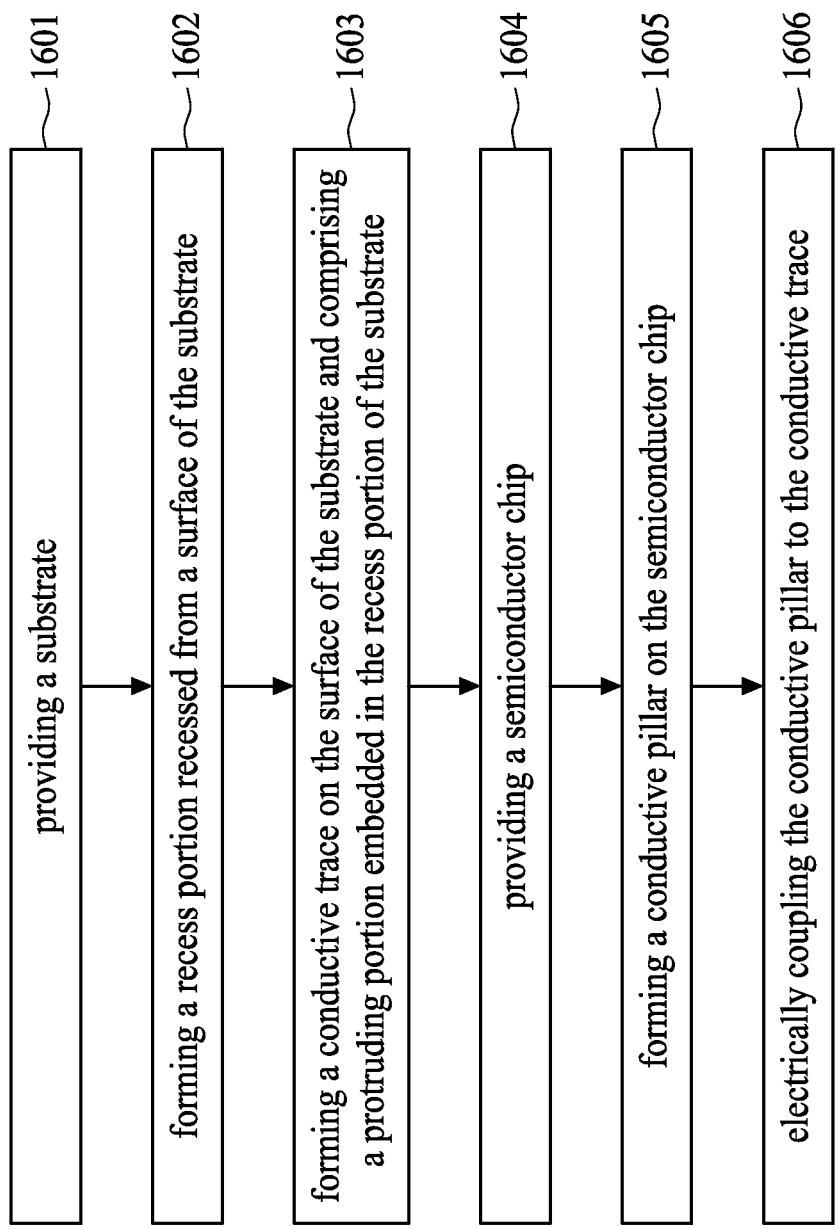
FIG. 16 represents a flow chart of manufacturing a semiconductor structure in accordance with some embodiments of the present disclosure.

FIG. 16 is a flowchart of a method of manufacturing a semiconductor structure as shown in FIG. 7. In operation 1601, a substrate is provided. In operation 1602, a recess portion is formed, wherein the recess portion is recessed from a surface of the substrate and may be configured to have different geometrical dimensions. In operation 1603, a conductive trace is formed on the surface of the substrate, wherein the conductive trace comprises a protruding portion embedded in and filling the recess portion of the substrate. In operation 1604, a semiconductor chip is provided. In operation 1605, a conductive pillar is formed on the semiconductor chip. In operation 1606, the conductive pillar is electrically coupled to the conductive trace. The conductive trace comprises (in a configuration same as those shown FIGS. 8A and 8B) a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3.

Figure 17A:
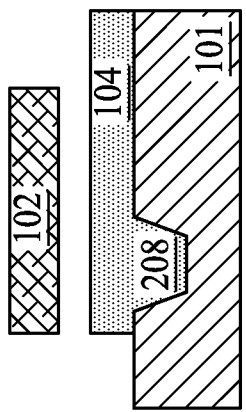
FIGS. 17A-17F schematically illustrates a method of manufacturing a semiconductor structure in accordance with some embodiments of the present disclosure.
Figure 17B:
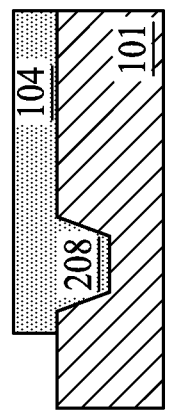
Figure 17C:
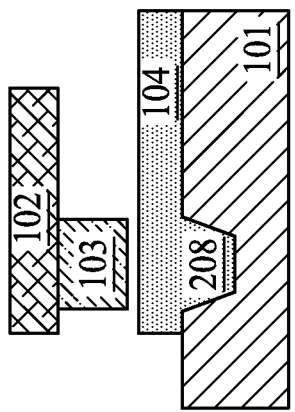
Figure 17D:
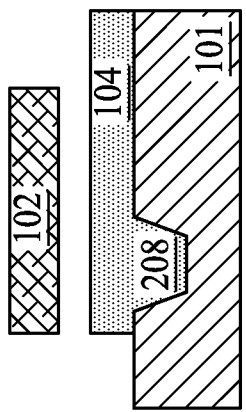
Figure 17E:
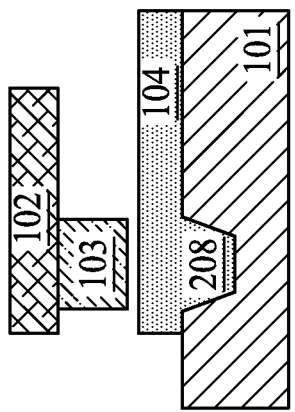
Figure 17F:
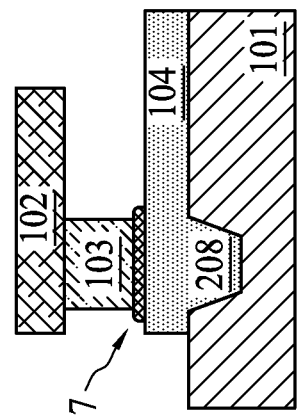

FIGS. 17A-17F schematically illustrates operations of the method of FIG. 16. In FIG. 17A, a substrate 101 is provided. In FIG. 17B, a recess portion 105 is recessed from a surface of the substrate 101. In FIG. 17C, a conductive trace 104 is formed on the surface of the substrate 101, wherein the conductive trace 104 comprises a protruding portion 208 embedded in and filling the recess portion 105 of the substrate 101. In FIG. 17D, a semiconductor chip 102 is provided. In FIG. 17E, a conductive pillar 103 is formed on the semiconductor chip 102. In FIG. 17F, the conductive pillar 103 is electrically coupled to the conductive trace 104 (with a conductor 107) in a BOT configuration.

Figure 18A:
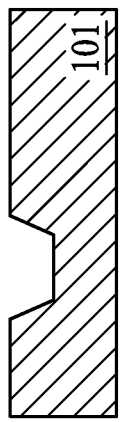
FIGS. 18A-18D schematically illustrate a method of forming a conductive trance on a surface of a substrate in accordance with some embodiments of the present disclosure.
Figure 18B:
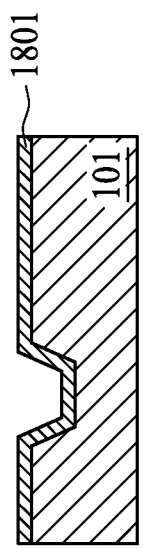
Figure 18C:
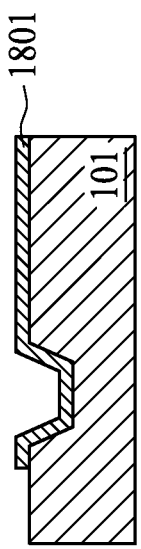
Figure 18D:
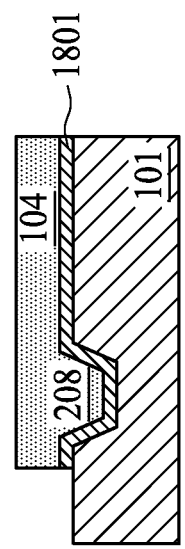

FIGS. 18A-18D illustrate a method for performing the operation 1603 ("forming a conductive trace on the surface of the substrate, wherein the conductive trace comprises a protruding portion embedded in and filling the recess portion of the substrate" namely the operation shown in FIG. 17C). In FIG. 18A, a substrate 101 with a recess portion 105 is provided. In FIG. 18B, a seed layer 1801 is formed on the substrate 101. In FIG. 18C, the seed layer 1801 is being patterned. In FIG. 18D, a conductor trace 104 comprising a protruding portion embedded in and filling the recess portion of the substrate is formed on the patterned seed layer 1801 by an electrochemical deposition process. For the operation shown in FIG. 18C, the patterning of the seed layer 1801 may use the same method as that depicted in FIGS. 14A-14G. For instance, a patented photoresist layer may be first formed on the seed layer 1801, the patterned photoresist layer acts as an etching mask and after an etching process is applied the exposed portion of the seed layer 1801 is etched away from the substrate 101.

Some embodiments of the present disclosure provide a semiconductor structure, including: a substrate comprising a recess portion filled with a conductive material; a conductive trace overlying and contacting the recess portion; a conductive pillar disposed on the conductive trace and over the recess portion of the substrate; and a semiconductor chip disposed on the conductive pillar, wherein the conductive trace comprises a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3.

Some embodiments of the present disclosure provide a semiconductor structure, including: a substrate comprising a recess portion recessed from a surface of the substrate; a conductive trace disposed on the surface of the substrate and comprising a protruding portion embedded in the recess portion of the substrate; a conductive pillar disposed on the conductive trace and over the recess portion of the substrate; and a semiconductor chip disposed on the conductive pillar, wherein the conductive trace comprises a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3.

Some embodiments of the present disclosure provide a method for forming a semiconductor structure, comprising: providing a substrate; forming a recess portion recessed from a surface of the substrate; filling the recess portion with a conductive material; forming a conductive trace on the surface of the substrate and overlying the recess portion of the substrate; providing a semiconductor chip; forming a conductive pillar on the semiconductor chip; and electrically coupling the conductive pillar to the conductive trace, wherein the conductive trace comprises a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application in not intended to be limited to the particular embodiments of the process, machine, manufacture, and composition of matter, means, methods and steps described in the specification. As those skilled in the art will readily appreciate from the disclosure of the present disclosure, processes, machines, manufacture, composition of matter, means, methods or steps presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, compositions of matter, means, methods or steps/operations. In addition, each claim constitutes a separate embodiment, and the combination of various claims and embodiments are within the scope of the disclosure.

What is claimed is:

1. A semiconductor structure, comprising:
   a substrate comprising a recess portion filled with a conductive material;
   a conductive trace overlying and contacting the conductive material;
   a conductive pillar disposed on the conductive trace and over the recess portion of the substrate; and
   a semiconductor chip disposed on the conductive pillar,
   wherein the conductive trace comprises a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3.

2. The semiconductor structure of claim 1, wherein a conductor is disposed between the conductive pillar and the conductive trace.

3. The semiconductor structure of claim 1, wherein the substrate is an epoxy-containing substrate.

4. The semiconductor structure of claim 3, wherein the epoxy-containing substrate comprises prepreg (PPG), or rubber coated copper (RCC).

5. The semiconductor structure of claim 1, wherein the conductive pillar comprises copper or alloy thereof.

6. The semiconductor structure of claim 1, wherein the projection of the recess portion on the surface of the substrate is circular.

7. The semiconductor structure of claim 1, wherein the projection of the recess portion on the surface of the substrate is oval.

8. The semiconductor structure of claim 1, wherein the projection of the recess portion on the surface of the substrate is rectangle.

9. The semiconductor structure of claim 1, wherein the conductive trace comprises copper or aluminum-copper alloys.

10. The semiconductor structure of claim 1, wherein $W_T$ is smaller than 20 microns.

11. A semiconductor structure, comprising:
    a substrate comprising a recess portion recessed from a surface of the substrate;
    a conductive trace disposed on the surface of the substrate and comprising a protruding portion embedded in the recess portion of the substrate;
    a conductive pillar disposed on the conductive trace and over the recess portion of the substrate; and
    a semiconductor chip disposed on the conductive pillar,
    wherein the conductive trace comprises a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3.

12. The semiconductor structure of claim 11, wherein the semiconductor chip comprises a CMOS device.

13. The semiconductor structure of claim 11 wherein the substrate comprises a second conductive trace in a layer different from the conductive trace, and an epoxy-containing insulative material separating the conductive trace and the second conductive trace.

14. The semiconductor structure of claim 11 wherein the substrate comprises a PCB (Printed Circuit Board).

15. A method for forming a semiconductor structure comprising:
- providing a substrate;
- forming a recess portion recessed from a surface of the substrate;
- filling the recess portion with a conductive material;
- forming a conductive trace on the surface of the substrate and overlying the conductive material of the substrate;
- providing a semiconductor chip;
- forming a conductive pillar on the semiconductor chip; and
- electrically coupling the conductive pillar to the conductive trace,
- wherein the conductive trace comprises a width $W_T$ and a thickness $T_T$, the recess portion of the substrate comprises a width $W_R$ in the width direction of the conductive trace and a depth $D_R$, and the ratio of $W_R$ to $W_T$ ranges from about 0.25 to about 1.8 and the ratio of $D_R$ to $T_T$ ranges from about 0.1 to about 3; and
- wherein the conductive pillar and the recess portion overlap in a direction substantially perpendicularly to the surface of the substrate.

16. The method of claim 15, wherein forming the recess portion comprises etching or laser drilling the surface of the substrate to form the recess portion.

17. The method of claim 15, wherein forming the conductive trace comprises:
- forming a seed layer on the surface of the substrate;
- patterning the seed layer; and
- forming the conductive trace on the patterned seed layer.

18. The method of claim 17, wherein forming a seed layer on the surface of the substrate comprises sputtering a layer of titanium, tantalum or alloy thereof on the surface of the substrate.

19. The method of claim 15, wherein coupling the conductive pillar to the conductive trace comprises coupling the conductive pillar to the conductive trace through a conductor.

20. The method of claim 17, wherein patterning the seed layer comprising removing a portion of the seed layer to expose a portion of the surface of the substrate.

* * * * *